United States Patent
Brugger et al.

(10) Patent No.: US 7,521,271 B2
(45) Date of Patent: Apr. 21, 2009

(54) METHOD OF MANUFACTURING A TRANSPONDER

(75) Inventors: Christian Brugger, Graz (AT); Reinhard Fritz, Graz (AT)

(73) Assignee: NXP B.V., Eindhoven (NL)

( * ) Notice: Subject to any disclaimer, the term of this patent is extended or adjusted under 35 U.S.C. 154(b) by 580 days.

(21) Appl. No.: 10/505,286

(22) PCT Filed: Feb. 3, 2003

(86) PCT No.: PCT/IB03/00357

§ 371 (c)(1),
(2), (4) Date: Aug. 19, 2004

(87) PCT Pub. No.: WO03/071476

PCT Pub. Date: Aug. 28, 2003

(65) Prior Publication Data

US 2005/0181530 A1 Aug. 18, 2005

(30) Foreign Application Priority Data

Feb. 19, 2002 (EP) .................... 02100148

(51) Int. Cl.
*H01L 21/60* (2006.01)
(52) U.S. Cl. .............. 438/25; 438/26; 438/51; 438/64; 438/113; 257/E23.007
(58) Field of Classification Search .......... 438/25, 438/26, 51, 64, 113; 257/E23.007
See application file for complete search history.

(56) References Cited

U.S. PATENT DOCUMENTS

| 5,386,214 | A | * | 1/1995 | Sugawara | ............ 343/700 MS |
| 6,140,146 | A | * | 10/2000 | Brady et al. | ................. 438/62 |
| 6,147,662 | A | | 11/2000 | Nash et al. | |
| 6,400,323 | B2 | * | 6/2002 | Yasukawa et al. | ..... 343/700 MS |
| 6,535,175 | B2 | * | 3/2003 | Brady et al. | ................ 343/795 |
| 2002/0003496 | A1 | * | 1/2002 | Brady et al. | ........ 343/700 MS |
| 2002/0057221 | A1 | * | 5/2002 | Matsushita et al. | .... 343/700 MS |
| 2002/0125546 | A1 | * | 9/2002 | Muta | ......................... 257/531 |
| 2004/0262722 | A1 | * | 12/2004 | Sekiguchi | ................. 257/676 |

FOREIGN PATENT DOCUMENTS

EP 0 994 440 4/2000

* cited by examiner

*Primary Examiner*—George Fourson

(57) ABSTRACT

A method of manufacturing a transponder (1) where a transponder IC (2) comprising two IC contacts (7, 8) is brought into communication-capable connection, via each time one of the IC contacts (7, 8), with one of two transmission element strips (13, 14) provided on a tape-like carrier (11) of an intermediate product (12), the intermediate product (12) then being cut through along cutting zones (16) extending perpendicularly to the longitudinal direction of the carrier and the transponder IC (2) being connected to the portion of the intermediate product (12) located between two cutting zones (16).

12 Claims, 2 Drawing Sheets

METHOD OF MANUFACTURING A TRANSPONDER

The invention relates to a method of manufacturing a transponder, which transponder is provided and designed for contactless communication with a communications station suitable therefor and which transponder comprises a transponder IC comprising two IC contacts and two substantially planar transmission elements.

The invention also relates to a transponder for contactless communication with a communications station suitable therefor, which transponder comprises a transponder IC comprising two IC contacts and two substantially planar transmission elements.

A method as described above in the first paragraph for manufacturing a transponder as described above in the second paragraph has long been known. In the known method, a "metal lead frame" configuration is used, which is of tape-like construction and in which there is provided a plurality of pairs of planar transmission elements lying next to one another in the longitudinal direction of this metal lead frame configuration, each transponder IC being connected via each of its two IC contacts to a transmission element from a pair of transmission elements, the transponder IC being connected to the pair of transmission elements in a mechanically stable manner by potting with a plastics compound, whereby a "module" is obtained which is connected to a transmission coil in the course of further execution of the method of manufacturing a transponder, this connection being achieved in that the two transmission elements of a pair of transmission elements are each electrically conductively connected to a terminal of the transmission coil, such that a finished transponder is obtained after said connection.

In the known method, a metal lead frame configuration is used, manufacture of which entails considerable expenditure, which is unfavorable from the point of view of manufacturing a transponder as cost-effectively as possible. The known method also involves the problem that each transponder IC has to be positioned with a relatively high level of precision relative to a pair of transmission elements, before the transponder IC is brought into communication-capable connection, via its IC contacts with the transmission elements of a pair of transmission elements, this which requires a relatively high degree of positioning effort during extension of the known method. In addition, for many applications of the known method the disadvantageous situation arises that the planar transmission elements of a metal lead frame configuration are set to a constant size and that it is therefore impossible to simply produce transponders with transmission elements of different sizes when such a metal lead frame configuration is used.

It is an object of the invention to avoid the above-mentioned disadvantages and to produce an improved method and an improved transponder in simple manner using simple means.

To achieve the above-mentioned object, a method according to the invention is characterized as follows:

A method of manufacturing a transponder, which transponder is provided and designed for contactless communication with a communications station suitable therefor and which transponder comprises a transponder IC comprising two IC contacts and two substantially planar transmission elements, in which method the transponder IC is brought into communication-capable connection via each time one of its two IC contacts with one of two transmission element strips provided on a tape-like carrier of an intermediate product and extending substantially parallel to the longitudinal direction of the carrier, and in which the intermediate product is then cut along two cutting zones extending perpendicularly to the longitudinal direction of the carrier and each lying at a distance from the transponder IC, and in which the transponder IC is connected to the portion of the intermediate product lying between the cutting zones.

By providing the features according to the invention, it is possible to provide, in a particularly simple way and using an intermediate product of particularly simple construction and producible in a particularly cost-effective manner, a method of manufacturing a transponder which offers the advantage that, when performing the method, a transponder IC has to be positioned relatively precisely with regard to the intermediate product used in only one direction extending perpendicularly to the longitudinal direction of the carrier, which position may be performed in a relatively simple manner, and that the relative position of a transponder IC relative to the intermediate product in the longitudinal carrier direction of the intermediate product is not critical. When performing the method according to the invention, it goes without saying that a plurality of transponder ICs are applied to the intermediate product in succession in the longitudinal direction of the carrier, so that with the method according to the invention the great advantage is obtained that the distances between the individual transponder ICs are not critical and may even be deliberately varied. With the method according to the invention the advantage is additionally obtained that cutting of the intermediate product is not critical with regard to the position of the cutting zones, because deviations in respect of the position of the actual cutting zones from a desired nominal position of the cutting zones have virtually no negative effects on the quality of the transponder produced. A further advantage obtained with the method according to the invention is that it is very simply possible to produce transmission elements of different sizes, by producing portions of the intermediate product of different sizes, this is made possible by appropriate selection of the position of the cutting zones relative to the transponder IC located between two cutting zones.

With a method according to the invention, a connection capable of capacitive communication may be produced between each IC contact and the relevant transmission element strip; this is highly desirable and advantageous for many applications. However, it has also proven advantageous when each IC contact is connected in electrically conductive manner the relevant transmission element strip. This ensures that each IC contact forms a connection capable of ohmic, i.e. electrically conductive, communication with the relevant transmission element strip.

With a method according to the invention, cutting of the intermediate product can be performed along cutting zones extending obliquely relative to the longitudinal direction of the carrier. It has proven particularly advantageous, however, when the cutting of the intermediate product is performed along cutting zones extending perpendicularly to the longitudinal direction of the carrier. The advantage is thereby obtained that the portions of intermediate product produced are of rectangular shape.

With a method according to the invention, a transponder IC may be connected to the intermediate product between two cutting zones by producing a laser weld joint or by producing a thermocompression joint. However, it has proven particularly advantageous when the transponder IC is connected to the portion of the intermediate product by a glued joint. Producing such a glued joint has proven particularly advantageous as a consequence of the use of the intermediate product consisting of the tape-like carrier and the two transmission element strips provided thereon.

With a method according to the invention, a transponder IC with a quadrilateral main surface may be used, in which transponder IC the IC contacts are formed by two IC contacts extending parallel to two mutually parallel delimiting edges and wherein the transponder IC being connected to the portion of intermediate product in such a position that the two IC contacts extending parallel to one another extend parallel to the longitudinal direction of the carrier. It has proven particularly advantageous, however, when a transponder IC with a quadrilateral main surface is used, in which transponder IC the IC contacts are provided in two corner areas of the main surface lying on a diagonal of the main surface, and the transponder IC is connected to the portion of the intermediate product in such a position that the diagonal of the main surface extends perpendicularly to the longitudinal direction of the carrier. In this way, the important advantage is obtained that the distance between the transmission element strips of the intermediate product may be selected to be of optimum size so as to match the large distance between the IC contacts; this is of particular importance and advantage if the portions of the intermediate product produced as planar transmission elements in the course of manufacture of the transponder are provided as communication elements for capacitive contactless communication.

A transponder according to the invention has advantageously been manufactured using a method according to the invention.

The above aspects of the invention and further aspects thereof emerge from the embodiments described below and are explained with reference to these embodiments.

The invention will be further described with reference to two embodiments shown in the drawings, to which, however, the invention is not restricted.

Figure 4:
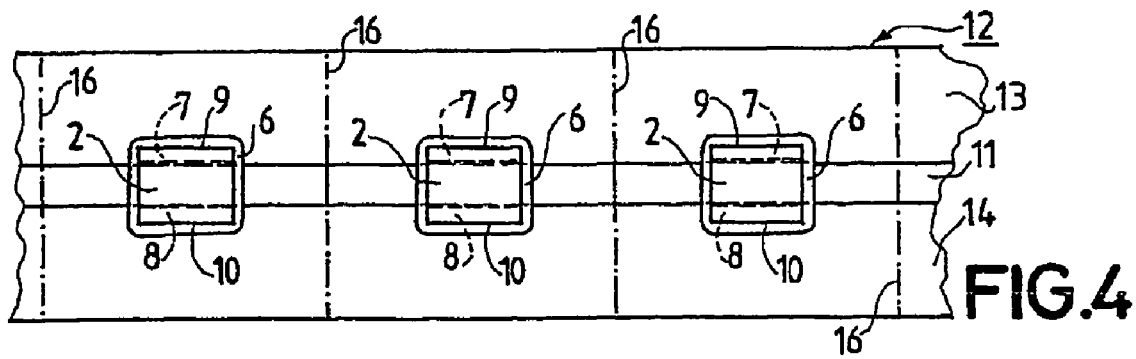
FIG. 4 shows, in similar manner to the FIGS. 2 and 3, the intermediate product according to the FIGS. 2 and 3 together with the three transponder ICs attached thereto and four cutting zones located adjacent to the transponder ICs.
Figure 5:
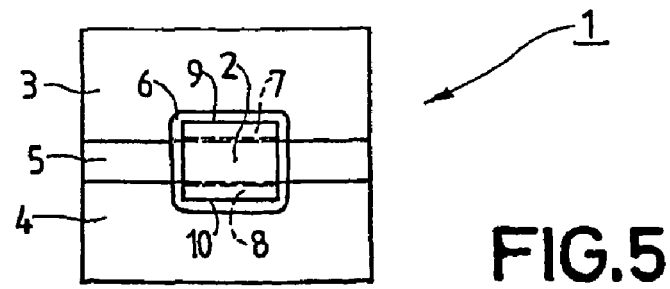
FIG. 5 is a plan view of a transponder produced by means of the intermediate product illustrated in the FIGS. 2 to 4.
Figure 6:
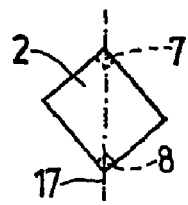
FIG. 6 shows, in similar manner to FIG. 1, a transponder IC with two IC contacts provided in corner areas lying diagonally opposite one another.
Figure 7:
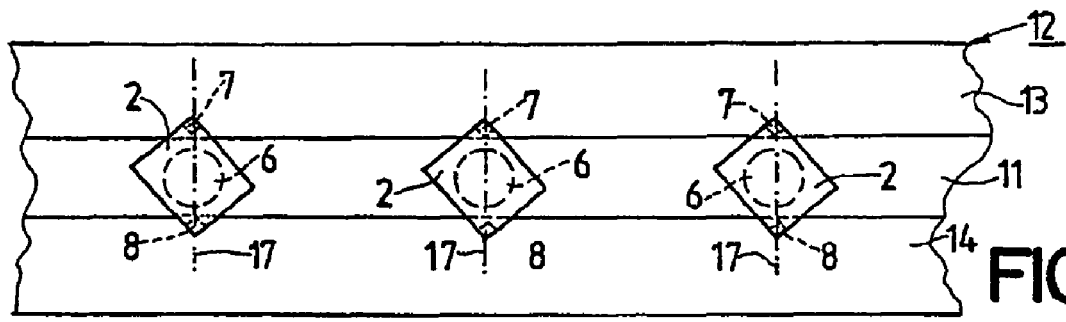
FIG. 7 shows, in similar manner to FIG. 3, an intermediate product with three transponder ICs according to FIG. 6 connected thereto.
Figure 8:
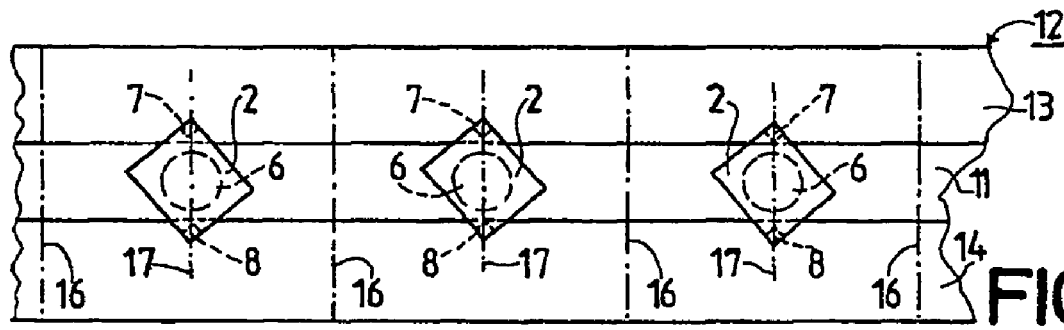
FIG. 8 shows, in similar manner to FIG. 4, an intermediate product with transponder ICs attached thereto and with four cutting zones provided thereon.

A method according to a first version of the invention for manufacturing a transponder 1, which transponder 1 is illustrated in FIG. 5, is described with reference to the FIGS. 1 to 5. The transponder 1 is provided and designed for contactless communication with a communications station suitable therefor. The transponder 1 includes a transponder IC 2 and two planar communication elements 3 and 4, which in the present case are capable of capacitive communication. The communication elements 3 and 4 are attached to a carrier element 5 and firmly connected mechanically to the carrier element 5 by means of glued joints (not shown). The transponder IC 2 is firmly connected mechanically to the carrier element 5 by means of a glued joint 6 indicated schematically in FIG. 5. In the present case, the transponder IC 2 comprises two IC contacts 7 and 8, which are each shaped as a strip and in their longitudinal strip direction extends parallel to two lateral delimiting edges 9 and 10 of the transponder IC 2, each contact being provided on the transponder IC 2 in such a manner as to be directly adjacent to one of the two delimiting edges 9 and 10.

Figure 1:
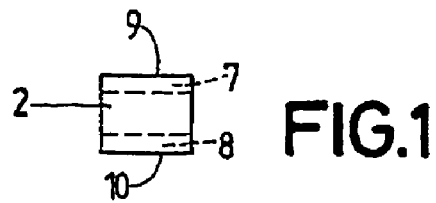
FIG. 1 is a schematic plan view of a transponder IC with two IC contacts each adjoining a lateral delimiting edge.
Figure 2:
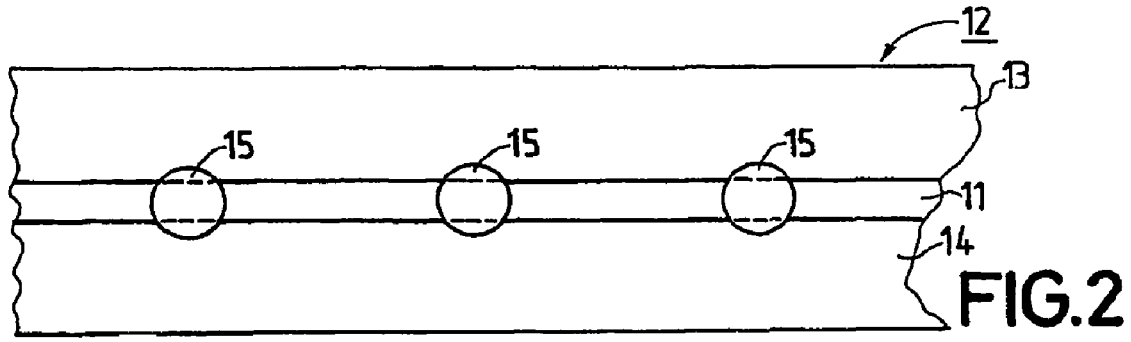
FIG. 2 is a plan view of an intermediate product with a tape-like carrier and two transmission element strips provided thereon.

To manufacture the transponder according to FIG. 5, the transponder IC 2 illustrated in FIG. 1 is brought into communication-capable connection via in each case one of its two IC contacts 7 and 8 with one of two transmission element strips 13 or 14 respectively provided on a tape-like carrier 11 of an intermediate product 12 and extending parallel to the longitudinal direction of the carrier. In the present case, a drop of glue 15 is applied to predetermined points of the intermediate product 12 prior to formation of a communication-capable connection between the two IC contacts 7 and 8 and the two transmission element strips 13 and 14. After application of the glue drops 15 to the intermediate product 12 a transponder IC 2 is in each case applied to the intermediate product 12, wherein, by means of the glue drops 15, a glued joint 6 is produced between each transponder IC 2 and the intermediate product 12, as is clear from FIG. 3. In addition to producing the glued joints 6, the communication-capable connections between each of the IC contacts 7 and 8 and the relevant transmission element strips 13 or 14, respectively, are also formed in this method step. In this instance, a connection capable of capacitive communication is produced in each case between the IC contacts 7 and 8 and the transmission element strips 13 and 14, because each glued joint 6 extends beyond the delimiting edges of the relevant transponder IC 2 and thus has an insulating effect between the IC contacts 7 and 8 and the transmission element strips 13 and 14. Through selection of suitable material, the glued joints 6 act as a dielectric.

The transmission element strips 13 and 14 each consist in this case of a copper foil which is glued to the carrier 11. However, the transmission element strips 13 and 14 may also each take the form of an aluminum foil. The transmission element strips 13 and 14 may also be produced by applying a carbon paste or another paste containing conductive particles to the carrier 11. The carrier 11 consists in this instance of paper. However, it may also consist of plastics, for example PVC or polyester.

Figure 3:
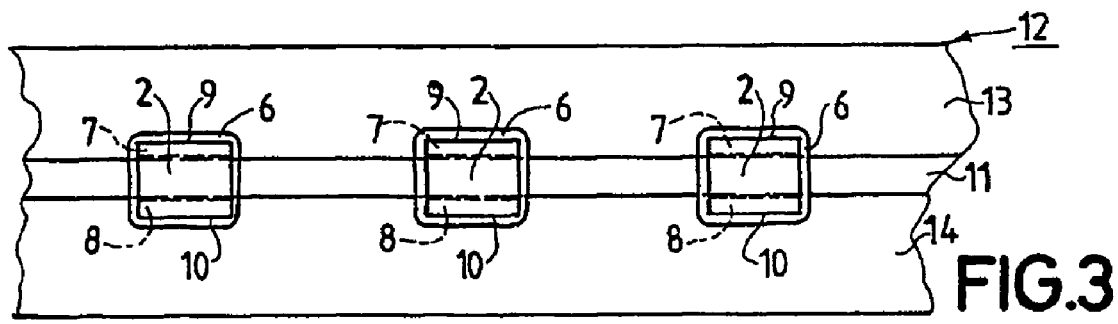
FIG. 3 shows, in similar manner to FIG. 2, the intermediate product according to FIG. 2 with three transponder ICs according to FIG. 1 connected thereto.

Once the intermediate product illustrated in FIG. 3 has been obtained, the intermediate product 12 comprising the tape-like carrier 11 and the two transmission element strips 13 and 14 provided on the tape-like carrier 11 is then cut through along, with regard to in each case one transponder IC 2, two cutting zones 16 extending transversely relative of the longitudinal direction of the carrier, and in the present case precisely perpendicularly to the longitudinal direction of the carrier and each located at a distance from the relevant transponder IC 2, which cutting zones 16 are indicated with dash-dotted lines in FIG. 4. After cutting along the cutting zones 16, a finished transponder 1 is in this case present between every two such cutting zones 16.

With the above-described method, connection of each transponder IC 2 to the portion of the intermediate product 12 located between two cutting zones 16 is effected by producing the glued joint 6 prior to cutting through the intermediate product 12 along the cutting zones 16. This does not absolutely have to be the case, because, in a modification of the above method, the transponder ICs 2 may be connected to the intermediate product 12 merely by means of a temporary connection, in order to ensure positioning of the respective transponder IC 2 on the intermediate product 12, final connection of each transponder IC 2 to the portion of the intermediate product 12 located between two cutting zones 16 is then effected only after cutting along the cutting zones 16, for example by laser welding.

A method according to a second version of the invention is described with reference to FIGS. 6 to 9. With this method, a transponder IC 2 with a quadrilateral main surface is used; in this transponder IC 2 the two IC contacts 7 and 8 are provided in two corner areas of the main surface which are located on a diagonal 17 of the main surface, as is clear from FIG. 6. The two IC contacts 7 and 8 comprise bumps raised relative to the main surface of the transponder IC 2. With this method, each transponder IC 2 is connected to the to the intermediate product 12, and consequently to the portion of intermediate product 12 obtained after cutting through along the cutting zones 16, in such a position that the diagonal 17 of the main surface extends perpendicularly to the longitudinal carrier direction of the intermediate product 12. To secure each transponder IC 2 to the intermediate product 12, a respective glued joint 6 is also provided in this case, which glued joint 6 in this case occupies so small an area that it does not effect any electrical insulation between the IC contacts 7 and 8 and the two transmission element strips 13 and 14. This results here in an ohmic, i.e. electrically conductive and consequently communication-capable connection being produced in each case between the IC contacts 7 and 8 and the transmission element strips 13 and 14. Such an ohmic connection may, however, also be produced by pressing the bumps provided as IC contacts 7 and 8 through the relevant glued joint, wherein the glued joints may then project beyond the delimiting edges of each transponder IC.

Figure 9:
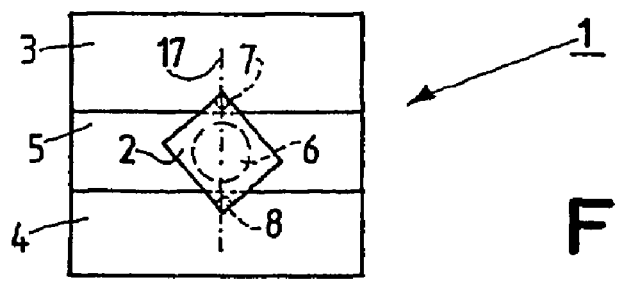
FIG. 9 shows, in similar manner to FIG. 5, a transponder produced by means of the intermediate product illustrated in the FIGS. 7 and 8.

Implementation of this method advantageously ensures that, with this method, an intermediate product 12 may be used in which the transmission element strips 13 and 14 provided on the carrier 11 may be spaced optimally perpendicularly to the longitudinal direction of the carrier; this has the advantage that, in the case of the finished transponder 1, the planar transmission elements 3 and 4 are at the largest possible distance from one another, which is especially significant and advantageous when the planar transmission elements 3 and 4 are provided for capacitive communication, as is the case with the transponder 1 according to FIG. 9.

The two methods according to the invention described with reference to the FIGS. 1 to 5 and 6 to 9, offer the considerable advantage that transponders may be manufactured very simply and cost-effectively. Other advantages of this method have already been mentioned above.

It should be mentioned that the planar transmission elements do not absolutely have to comprise a continuous surface throughout; rather, such planar transmission elements may also be provided with at least one through-hole or be of more or less net-like construction.

It should also be mentioned that the planar transmission elements produced by means of the transmission element strips 13 and 14 do not absolutely have to be provided for capacitive communication; rather, such planar transmission elements may also be provided with a transmission coil for producing electrically conductive and, consequently, transmission-capable and communication-capable connections, the transmission coil then being provided and used for contactless communication with a communications station suitable therefor.

In the cases described above, the transmission element strips are defined by linear delimiting edges extending parallel to the longitudinal direction of the carrier. This does not absolutely have to be the case, because such transmission element strips may also be delimited by wavy or sawtooth-shaped or zigzag edges, in particular in the inner edge areas which lie adjacent the central area of the carrier.

The invention claimed is:

1. A method of manufacturing a transponder, which transponder is provided and designed for contactless communication with a transponder IC comprising two IC contracts and two substantially planar transmission elements, in which method the transponder IC is brought into communication-capable connection, via each one of its two IC contacts with a corresponding one of two transmission element strips provided on a tape-like carrier of an intermediate product and extending substantially parallel to the longitudinal direction of the carrier and in which the intermediate product is then cut through along two cutting zones extending perpendicularly to the longitudinal direction of the carrier and each lying at a distance from the transponder, and in which the transponder ID is connected to the portion of the intermediate product lying between the cutting zones, wherein each IC contact is in capacitive communication with the relevant transmission element strip.

2. A method as claimed in claim 1, wherein the transponder IC is connected to the portion of the intermediate product by a glued joint.

3. A method as claimed in claim 1, wherein a transponder IC with a quadrilateral main surface is used, in which transponder IC the IC contacts are provided in two corner areas of the main surface lying on a diagonal of the main surface and wherein the transponder IC is connected to the portion of the intermediate product in such a position that the diagonal of the main surface extends perpendicularly to the longitudinal direction of the carrier.

4. The method of claim 1, wherein the two transmission element strips provided on the tape-like carrier of the intermediate product include the two substantially planar transmission elements of the transponder and two substantially planar transmission elements for another transponder.

5. The method of claim 4, wherein when the intermediate product is then cut through along two cutting zones extending perpendicularly to the longitudinal direction of the carrier and each lying at a distance from the transponder, the cutting separates the two substantially planar transmission elements for the other transponder.

6. The method of claim 1, wherein when the intermediate product is then cut through along two cutting zones extending perpendicularly to the longitudinal direction of the carrier and each lying at a distance from the transponder, said cutting cuts through both of the two transmission element strips to separate the two substantially planar transmission elements from the two transmission element strips.

7. The method of claim 1, wherein the two transmission element strips are each longer in the longitudinal direction than in a transverse direction perpendicular to the longitudinal direction.

8. The method of claim 1, wherein the two IC contacts are provided as strips extending opposite along opposite edges of the transponder IC.

9. A method of manufacturing a transponder provided and designed for contactless communication with a communications stations suitable therfor and which transponder comprises a transponder IC comprising two IC contacts and two substantially planar transmission elements, the method comprising:

providing a tape-like carrier of an intermediate product having two transmission element strips provided thereon, said transmission element strips extending parallel to each other along a longitudinal direction of the carrier which is longer than a transverse direction of the carrier;

bringing each of the IC contracts of the transponder IC into communication-capable connection with a corresponding one of the two transmission element strips;

cutting through the carrier and the two transmission element strips along two cutting zones extending perpendicularly to the longitudinal direction of the carrier and each lying at a distance from the transponder and in which the transponder IC is connected to a portion of the intermediate product lying between the cutting zones, wherein each IC contact is in capacitive communication with the relevant transmission element strip.

10. The method of claim 9, further comprising gluing the transponder IC to the tape-like carrier.

11. The method of claim 8, wherein the transponder IC has a quadrilateral main surface, in which transponder IC, the IC contacts are provided in two corner areas of the main surface lying on a diagonal of the main surface and wherein the transponder IC is connected to the portion of the intermediate product in such a position that the diagonal of the main surface extends perpendicularly to the longitudinal direction of the carrier.

12. The method of claim 11, further comprising gluing the transponder IC to the tape-like carrier.

* * * * *